COMPOSITE DUAL DIELECTRIC FOR ISOLATION IN INTEGRATED CIRCUITS AND METHOD OF MAKING
Filed Oct. 26, 1964

SELECT SILICON WAFER

ETCH SILICON WAFER

GROW SILICON DIOXIDE

REMOVE SILICON TO EXPOSE SUBSTRATE

GROW SILICON NITRIDE

DEPOSIT SILICON SUBSTRATE

INVENTOR.
GEORGE A. LARCHIAN
BY A. M. Fernandez
ATTORNEY

United States Patent Office 3,385,729
Patented May 28, 1968

3,385,729

COMPOSITE DUAL DIELECTRIC FOR ISOLATION IN INTEGRATED CIRCUITS AND METHOD OF MAKING

George A. Larchian, Northridge, Calif., assignor to North American Rockwell Corporation, a corporation of Delaware Filed Oct. 26, 1964, Ser. No. 406,471
11 Claims. (Cl. 117—200)

ABSTRACT OF THE DISCLOSURE

A dual dielectric for isolation of integrated circuits comprising a film of silicon dioxide and an adjacent film of silicon nitride. The dual dielectric is useful for isolating single crystal semiconductor elements from a polycrystalline substrate. The dual dielectric may be produced by thermally or pyrolytically growing silicon dioxide on a silicon substrate, and subsequently providing a film of silicon nitride atop the $SiO_2$. The silicon nitride may be prepared by thermal decomposition of ammonia.

This invention relates to an improved structure for isolating semiconductor devices on a common crystalline substrate and a method for making same. More particularly, it relates to a composite dual dielectric of silicon dioxide and silicon nitride for integrated circuits on which a silicon substrate may be vapor deposited.

In copending application Ser. No. 339,717, filed Jan. 23, 1964, a division of application Ser. No. 327,990 filed Dec. 4, 1963, now abandoned, for Electrically Isolated Semiconductor Devies on Common Crystalline Substrate, a method was described for isolating semiconductor segments on a common crystalline substrate by selectively etching grooves or channels in the reserve side of a high grade single crystal semiconductor wafer; thermally growing a dielectric film of silicon dioxide on the etched channel side of the semiconductor wafer; including the surfaces of the channels; vapor depositing polycrystalline silicon on the dielectric film of silicon dioxide to fill the isolating channels and provide a common substrate; and lapping the obverse side of the semiconductor wafer until the deposited substrate in the isolating channels is exposed. To facilitate the vapor deposition of the silicon crystalline substrate, the surface of the thermally grown silicon dioxide is coated with carbon particles which react at elevated temperatures (approximately 1200° centigrade) with the silicon dioxide to form needle-like silicon carbide particles that serve as growth nucleation centers for the vapor deposited polycrystalline silicon. That is accomplished by coating the silicon dioxide film with a mixture containing a hydrocarbon or collodial carbon in a suitable solvent and then heating the coated surface to thermally decompose the coating to free carbon which combines with the silicon dioxide film according to the reaction $$SiO_2(s)+3C(s)\rightarrow 2CO(g)+SiC(s)$$

The foregoing process may be carried out in a standard reaction chamber, such as a quartz tube containing a suitable susceptor comprising quartz enclosed graphite and heated by induction with an RF generator. However, if silicon carbide particles are to be employed for nucleation of undoped, fine-grained polycrystalline growth, the wafer must be removed from the reactor after the silicon dioxide film has been thermally grown in order to coat it with a hydrocarbon or colloidal carbon which will react with the silicon dioxide at elevated temperatures in the manner just described before vapor depositing the polycrystalline silicon substrate.

To obviate the necessity of removing the wafer from the reactor after the silicon dioxide has been thermally grown, it would be desirable to provide a film other than silicon carbide produced by a vapor phase chemical reaction in the reactor itself. In that manner, a polycrystalline substrate of silicon may be vapor deposited on the isolating dielectric without the necessity of removing the wafer from the reactor for some intermediate step.

An object of this invention is to provide an improved process for vapor depositing a polycrystalline substrate of silicon dioxide. To accomplish that, a composite dual dielectric film is formed by treating the thermally grown silicon dioxide with high purity anhydrous ammonia at an elevated temperature so that extensive thermal dissociation of the ammonia gas will provide active nitrogen which will react with the silicon dioxide to form silicon nitride.

The reaction of the thermally dissociated ammonia with the silicon dioxide may be controlled by regulating surface temperature, the reaction time and the flow rate of the ammonia gas either by itself or in a mixture of ammonia and nitrogen, or other inert gas as a carrier, although nitrogen is preferred for controlling the equilibrium of the reaction $$2NH_3\rightleftharpoons N_2+3H_2$$

After the reaction has been completed, the reactor may be flushed with an inert gas such as nitrogen before vapor depositing the polycrystalline silicon substrate. In that manner, the substrate is deposited on the dielectric without ever removing the wafer from the reactor, and if desired, without even changing the surface temperature of the wafer.

For proper isolation between the single crystal silicon and vapor deposited polycrystalline silicon substrate, the silicon dioxide film should be thermally grown to a thickness of approximately 10,000 or 12,000 angstroms. Such a dielectric film provides adequate electrical insulation for integrated circuits with a capacitance of less than .002 picofarad per square mil. A conversion of the silicon dioxide into silicon nitride to a depth of only 500 to 2000 angstroms will provide adequate growth nucleation centers for a rapid and uniform vapor deposition of the polycrystalline silicon substrate. The resulting composite dual dielectric film exhibits improved voltage break-down characteristics with only slightly greater capacitance per unit area.

Another object of this invention is to provide a composite dual dielectric film for isolating discrete active device areas for integrated circuits, although the most important aspect of the invention is the improved method of providing nucleating growth centers on a silicon dioxide film for rapid uniform growth of a polycrystalline (doped or undoped) silicon substrate.

Other objects and advantages will become apparent from the following description with reference to the drawings in which.

Figure 1:
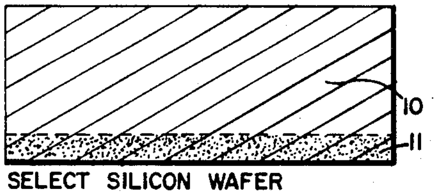
FIGURE 1 is a cross section of at least a portion of a single crystal semiconductor wafer having a zone extending throughout the reverse side thereof doped N+.

In one embodiment of the invention the semiconductor wafer to be processed is selected to be high grade single crystal silicon uniformly doped with N type impurities in one zone 10 and more heavily doped by a diffussion process through the reverse side thereof, for example, with impurities of the same type to provide a second zone 11 as shown in FIGURE 1. By starting with such a structure, the zone 10 may be processed by selective diffusion techniques to form active devices, such as transistors with a low collector-to-emitter impedance, as well as diodes, resistors, etc., but not until after segments have been suitably isolated in accordance with the invention disclosed in the aforesaid co-pending application, preferably by using a composite dual dielectric for isolation in accordance with the present invention.

The silicon wafer of FIGURE 1 is selected to be at least seven or fifteen mils thick so that after it has been processed in accordance with this invention and the upper zone 10 has been lapped and polished or etched back, five to fifteen microns of isolated single crystal silicon material will remain for fabrication into integrated circuit devices.

Figure 2:
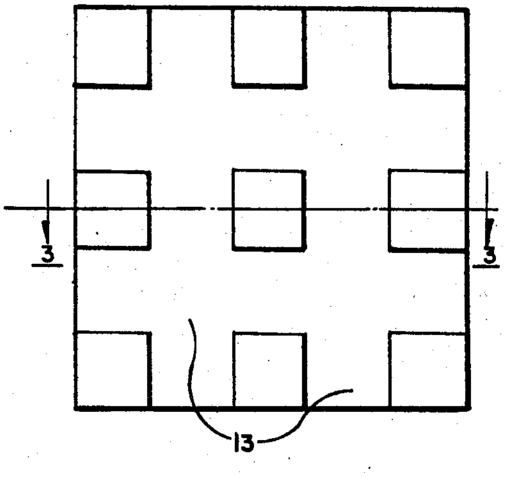
FIGURE 2 is a plan view of the semiconductor wafer of FIGURE 1 showing a typical pattern of isolating channels etched in the reverse side thereof.
Figure 3:
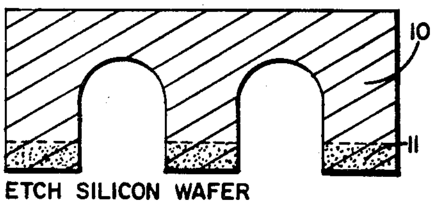
FIGURES 3 to 7 are cross sections of the semiconductor wafter of FIGURE 1 illustrating various stages of the process for providing isolated segments of single crystal silicon embedded in a common polycrystalline substrate.

The wafer is suitably prepared by first polishing its reverse side and then etching the desired pattern of isolation channels 13 as shown in FIGURES 2 and 3. In order to restrict the channel etching to the pattern of FIGURE 2, a mask is applied to all surfaces of the wafer using a suitable photoresist applied by conventional methods, such as brushing, dipping, spraying or the like, and then whirling the wafer if desired to insure a uniform coating of the photoresist. A latent image of the pattern is then produced by exposing the side of the wafer to be etched to ultra violet light through a suitable negative. The latent image is then developed by methods well known in the art and the wafer is channel etched. Thereafter, the wafer is again cleaned and then placed in a reactor for processing in accordance with this invention.

An alternative method of etching the desired pattern of FIGURE 2 in the silicon wafer is to employ the photoresist mask just described on a film of silicon dioxide first thermally grown on the reverse side of the wafer. After the photoresist mask is developed, a suitable etchant is then employed to dissolve exposed regions of the silicon dioxide film. A suitable etchant for the silicon dioxide is a buffer solution of hydrofluoric acid and ammonium-fluoride. The channels are then etched in the semiconductor wafer using a suitable etchant which dissolves the silicon of the wafer more rapidly than the silicon dioxide. In that manner, the etched silicon dioxide functions as a mask while etching the single crystal silicon of the wafer. A suitable etchant for the single crystal silicon is a mixture (2:15:5) of 48 to 50% (by weight) hydrofluoric acid, 68 to 70% (by weight) nitric acid and glacial acetic acid. The depth of the etch is so controlled as to leave sufficient material on the observe side to hold the etched structure together for further processing. A channel depth of 30 to 33 microns has been found to be sufficient. Before the wafer is further processed in accordance with this invention, the silicon dioxide mask is preferably removed and the etched reverse side of the wafer suitably prepared for further processing by cleaning.

Figure 4:
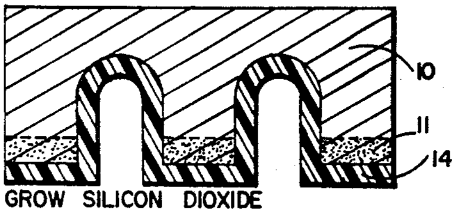

The wafer is next subjected to an oxidizing treatment which will thermally grow a silicon dioxide film 14 on the etched reverse side as shown in FIGURE 4. The silicon dioxide may be thermally grown on all sides of the wafer and later removed from the other sides or be limited to the etched reverse side of the wafer by suitably masking the other sides.

The silicon dioxide film is thermally grown to a thickness between 2,000 and 20,000 angstroms but preferably between 8,000 and 12,000 angstroms. A typical thickness for general application in integrated circuits is 12,000 angstroms, but by relying on the improved voltage break-down characteristics of the composite dual dielectric formed in the next step, an oxide film of 6,000 angstroms may be adequate if the comcomitant higher capacitance can be accommodated in the integrated circuit design. For instance, thermally grown silicon dioxide films of about 12,000 angstroms have been found to have a break-down voltage range of from 350 to 475 volts DC and a capacitance of about .016 picofarad per square mil whereas a composite dual dielectric film of the same thickness produced in accordance with this invention have been found to have a higher break-down voltage range of from 500 to 750 volts DC and a capacitance of about .03 picofarad per square mil. If larger capacitance can be accommodated in the application of the structure, such as .048 picofarad per square mil, a composite dual dielectric film of only 6,000 angstroms may be provided with approximately the same voltage break-down range as a silicon dioxide film of 12,000 angstroms.

To thermally grow the silicon dioxide film, a dry oxidizing process may be employed, such as by heating the surface temperature of the wafer to 1200° C. in the reactor and flowing oxygen with very little or no water over the surface. However, water vapor is a preferred oxidizing agent. In actual practice, hydrogen gas containing a prescribed amount of water vapor is flowed past the silicon wafer, the surface of which has been heated to 1200° centigrade. That may be readily accomplished by using a water bubbler maintained at 80 to 90° centigrade with a hydrogen gas flow rate of 1 to 5 liters per minute for 1 to 2 hours. As noted hereinbefore, a particular advantage of the present invention is that all of the steps beginning with the thermal growing of the silicon dioxide film may be performed in a reactor inductively heated by a radio frequency generator or in a resistance heated oven, if preferred, since all of the steps consists only of passing a gas or vapor over the surface of the semiconductor body or structure. Although in practice each step may be carried out at 1200° centigrade, a different temperature may be employed at each step for optimum results, particularly if an inductively heated reactor system is employed instead of a resistance heated oven since temperatures may be rapidly changed over a wide range with such a system.

After the desired thickness of silicon dioxide has been thermally grown on the etched side of the silicon wafer to provide the structure illustrated in FIGURE 4, the reactor chamber is flushed for 2 to 3 minutes with pure nitrogen gas using a flow rate of 2 to 5 liters per minute. Other inert gases such as argon may be employed to flush out the quartz tube of the reactor but nitrogen is preferred.

The next step is to form the silicon nitride film on the silicon dioxide to provide a composite dual dielectric film on which silicon may be readily deposited to form a polycrystalline substrate. The silicon nitride illustrated as a film 15 in FIGURE 5 is produced by the thermal dissociation reaction of anhydrous ammonia gas while it is flowed past the heated surface of the silicon dioxide maintained at a surface temperature between 900° and 1300° C., preferably about 1200° C., according to the reaction $$3SiO_2(s)+4NH_3(g)\rightarrow Si_3N_4(s)+6H_2O(g)$$

It can be shown through the application of classical thermodynamic considerations that the foregoing reaction is thermodynamically feasible and that the minimum temperature required at atmospheric pressure for the reaction is about 900° centigrade. The flow rate may vary anywhere from 40 to 400 milliliters or more up to about one liter per minute and may be continued for a period from more than 30 minutes to 2 hours or more. The preferred flow rate is 40 to 50 milliliters per minute. At that low flow rate a good silicon nitride film is produced on the silicon dioxide in a period of 45 minutes. Although high purity anhydrous ammonia gas is preferred, a mixture of anhydrous ammonia gas with from 5 to 20% pure nitrogen may be employed, and a small amount of water vapor may be tolerated.

Figure 6:
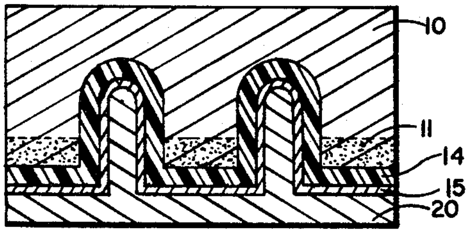

After the silicon nitride film 15 has been produced, the quartz tube of the reactor is again flushed with nitrogen, or some other inert gas for 2 to 3 minutes, before vapor depositing a silicon substrate 20 as shown in FIGURE 6.

Figure 5:
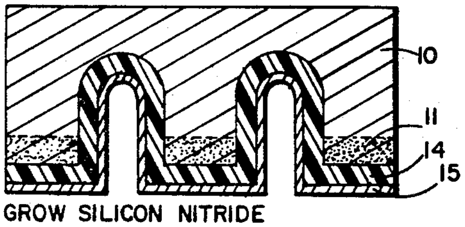

To deposit the silicon substrate, the structure of FIGURE 5 is first subjected to a gas stream which is initially hydrogen gas at 20 to 30 liters per minute. The surface temperature of the silicon nitride film is preferably adjusted to approximately 1050° centigrade as measured with an optical pyrometer, allowing 3 to 5 minutes for thermal equilibrium to be attained, although good vapor deposition of silicon may be achieved at other temperatures within the range of approximately 900° to 1300° C.

After the hydrogen gas has replaced the inert nitrogen gas in the quartz tube of the reactor, a large quantity of silicon tetrachloride vapor is injected into the hydrogen gas stream by passing hydrogen gas at the rate of 1000 to 2000 liters per minute into a silicon tetrachloride saturator bottle maintained at about 25° centigrade. As the silicon tetrachloride vapor flows past the heated surface of the silicon nitride, a very rapid growth of polycrystalline silicon ensues uniformly over the entire surface of the silicon nitride. Because such a rapid, uniform and complete growth coverage of polycrystalline silicon on the silicon nitride is repeatedly experienced, it is believed that sharp points or needle-like protrusions of silicon nitride are produced on the surface of the oxide which has been converted to silicon nitride that form growth nucleating centers during the vapor deposition of polycrystalline silicon. The deposition process is allowed to continue until four to eight mils, or more, of polycrystalline (undoped or doped) silicon has been deposited. The structure is then cooled in a stream of hydrogen gas at 20 to 30 liters per minute until the wafer temperature is 100° centigrade or less and then the hydrogen gas is replaced with nitrogen at 20 to 30 liters per minute for 2 to 3 minutes and then removed from the reactor.

After the structure has been removed from the reactor, some of the deposited polycrystalline silicon substrate may be lapped and polished or etched or otherwise removed to provide a smooth surface parallel to the interface between the silicon dioxide film 20 and the zone 11 of the semiconductor wafer.

Figure 7:
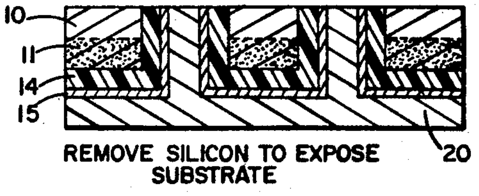

In the final step, the obverse side (exposed surface of the zone 10) is lapped and polished and etched or otherwise removed until the vapor deposited crystal in the isolating channels is exposed as shown in FIGURE 7. In that manner, a plurality of semiconductor segments are embedded in a common crystalline substrate, each electrically isolated from the substrate by a composite dual dielectric film of silicon dioxide and silicon nitride. The isolated segments may then be further processed to produce integrated circuit devices in the conventional manner known to those skilled in the art of producing integrated circuits.

It should be noted that FIGURES 1 to 7 are intended to illustrate but one embodiment of the invention in various steps of preparation, and that the dimensions illustrated are not proportional. Moreover, it should be noted that a sandwich structure of silicon composite dual dielectric and silicon may be made for some applications instead or isolated segments of silicon as illustrated.

While the principles of the invention have now been made clear in an illustrative embodiment, there will be immediately obvious to those skilled in the art many modifications in structure, arrangements, processes, proportions and materials. The appended claims are therefore intended to cover and embrace any such modifications, within the limits only of the true spirit and scope of the invention.

What I claim is:

1. The process of forming silicon nitride on the heated surface of a silicon dioxide film covering a semiconductor substrate by thermal dissociation of gaseous ammonia to form active atomic nitrogen and active atomic hydrogen which react with the silicon dioxide to form silicon nitride and water vapor.

2. A method of providing an improved dielectric on a silicon crystal by producing a silicon dioxide film on said crystal, and providing a silicon nitride coating atop said silicon dioxide film.

3. A method of providing an improved dielectric on a silicon crystal by producing a silicon dioxide film on said crystal, heating said crystal to a surface temperature of between about 900° centigrade and about 1300° centigrade in a reaction chamber and passing ammonia gas over the heated substrate.

4. A method of providing an improved dielectric on a silicon crystal by producing a silicon dioxide film on said crystal within a reaction chamber at a temperature between about 900° centigrade and about 1300° centigrade, flushing said chamber with an inert gas at a suitable flow rate to clear the chamber of all other gases, and passing over the heated substrate an ammonia gas at a flow rate between about 40 milliliters and about 1 liter per minute.

5. The process of forming a composite dual dielectric between a single crystal of silicon and polycrystalline silicon comprising the steps of:

producing a silicon dioxide film on said crystal,
forming silicon nitride on the surface of said film, and
vapor depositing polycrystalline silicon on said silicon nitride.

6. The process defined in claim 5 wherein said single crystal of silicon contains channels into which said dual dielectric and said polycrystalline silicon extend, and wherein part of the obverse side of said single crystal is removed subsequent to deposition of polycrystalline silicon to isolate segments of said single crystal silicon.

7. The process defined in claim 6 wherein said silicon nitride is formed by thermal dissociation of gaseous ammonia passed over said film while said film is heated to a surface temperature of between about 900° centigrade and about 1300° centigrade.

8. The process of forming within a reaction chamber a composite dual dielectric of silicon dioxide and silicon nitride between a single crystal of silicon and polycrystalline silicon by thermally growing a silicon dioxide film on said crystal, forming silicon nitride on the surface of said film by a thermal dissociation reaction of gaseous ammonia passed over said film heated to a surface temperature of between about 900° centigrade to about 1300° centigrade, and vapor depositing polycrystalline silicon on said silicon nitride by the hydrogen reduction of silicon tetrachloride while said silicon nitride is heated to a surface temperature between about 900° centigrade to about 1300° centigrade.

9. A process for producing a composite dual dielectric film of silicon dioxide and silicon nitride comprising passing the thermal dissociation reaction products of ammonia gas over a silicon dioxide film heated to a surface temperature between about 900° centigrade and 1300° centigrade.

10. A body comprising a semiconductor, a composite dielectric on said semiconductor, said composite dielectric comprising a layer of silicon dioxide and a layer of silicon nitride.

11. A body comprising a plurality of single crystal semiconductor segments embedded in a common substrate, and wherein each of said segments is electrically isolated from said substrate by a composite dielectric comprising a layer of silicon dioxide and a layer of silicon nitride.

References Cited

UNITED STATES PATENTS

| | | | |
|---|---|---|---|
| 1,415,280 | 5/1922 | Bichowsky | 23—191 |
| 2,501,051 | 3/1950 | Henderson et al. | 117—106 |
| 2,865,715 | 12/1958 | Kamlet | 23—191 |
| 2,992,127 | 7/1961 | Jones | 117—215 |
| 3,222,438 | 12/1965 | Parr et al. | 23—191 X |
| 3,246,214 | 4/1966 | Hugle | 117—106 |
| 3,273,033 | 9/1966 | Rossmeisl | 117—217 X |
| 3,290,753 | 12/1966 | Chang | 117—215 X |

ALFRED L. LEAVITT, *Primary Examiner.*

WILLIAM I. BROOKS, *Examiner.*

C. K. WEIFFENBACH, *Assistant Examiner.*